United States Patent [19]

Nabiev et al.

[11] Patent Number: 5,760,419
[45] Date of Patent: Jun. 2, 1998

[54] MONOLITHIC WAVELENGTH METER AND PHOTODETECTOR USING A WAVELENGTH DEPENDENT REFLECTOR

[75] Inventors: Rashit F. Nabiev, Mountain View; Constance J. Chang-Hasnain, Palo Alto, both of Calif.; Lars E. Eng, Fogelsville, Pa.; Kam-Yin Lau, Danville, Calif.

[73] Assignees: The Board of Trustees of the Leland Stanford Junior University, Stanford; The Regents of the University of California, Berkeley, both of Calif.

[21] Appl. No.: 688,866

[22] Filed: Jul. 31, 1996

[51] Int. Cl.[6] .................................................. H01L 29/06
[52] U.S. Cl. ........................ 257/21; 257/184; 257/432; 257/437
[58] Field of Search ........................ 257/21, 184, 432, 257/436, 437, 448, 452, 457, 458, 459

[56] References Cited

U.S. PATENT DOCUMENTS 5,227,648  7/1993  Woo .................................... 257/185

Primary Examiner—Minh-Loan Tran
Attorney, Agent, or Firm—Lumen Intellectual Property Services

[57] ABSTRACT

A compact and cost-effective wavelength meter and photodetector (10) that can measure simultaneously both wavelength and intensity has two back-to-back photodiodes (12 and 14) with a wavelength dependent distributed Bragg reflector (DBR) (28) positioned in-between. The wavelength resolution of this device is 1 nm or less. Easy design and fabrication of the device provides for reliable and cost-effective manufacturing. Applications include instrumentation and wavelength-division-multiplexing (WDM) in optical communication systems.

28 Claims, 5 Drawing Sheets

MONOLITHIC WAVELENGTH METER AND PHOTODETECTOR USING A WAVELENGTH DEPENDENT REFLECTOR

This invention was supported in part by National Science Foundation contracts ECS-93-18446 and ECS-93-19917. The Government has certain rights in the invention.

RELATED APPLICATIONS

This application is based on U.S. Provisional Application, serial number 60/001,734 filed Jul. 31, 1995, which is incorporated herein by reference.

FIELD OF THE INVENTION

The present invention relates to monolithic wavelength meters and photodetectors equipped with wavelength-dependent reflectors and methods of using them.

BACKGROUND OF THE INVENTION

Compact and cost-effective wavelength meters and photodetectors are in great demand for numerous applications, including instrumentation and wavelength division multiplexed (WDM) communications systems. All these applications are based on power measurement, and thus photodiodes are necessary for these applications.

A very popular traditional photodiode is a p-i-n photodiode. It consists of three layers of semiconductor materials. If the top layer is an n-doped (or p-doped) semiconducting material, then the bottom layer is a p-doped (or n-doped) semiconducting material. Interposed between top and bottom layers is an active layer, also called an intrinsic layer or depletion region. The advantage of this structure is that the thickness of the active layer can be tailored to optimize the quantum efficiency and frequency response of the photodiode. Over a 2-3 µm wavelength range, the quantum efficiency of this kind of photodiode is a strong function of the wavelength, and for any given semiconductor the wavelength range in which appreciable photocurrent can be generated is limited. The long-wavelength cutoff is determined by the energy gap of the semiconductor. For wavelengths longer than the long-wavelength cutoff, the absorption constant is too small to give an appreciable absorption. The short-wavelength cutoff of the photoresponse comes about because the value of the absorption constant for short wavelengths is very large, and the radiation is absorbed very near the surface where the recombination time is short. The photocarriers thus can recombine before they are collected in the p-n junction. However, the change of responsivity for the wavelengths between these two cutoff wavelengths is still relatively low. The responsivity is the ratio of the photocurrent to the optical power and can be written by $R = \eta \lambda / 1.24$ A/W, where $\lambda$ is wavelength in µm and $\eta$ is the quantum efficiency. Therefore, for a given efficiency, the relative change of responsivity between two wavelengths $\lambda$ and $\lambda + \Delta\lambda$ is $\Delta\lambda/\lambda$. For wavelengths in the 1 µm region with a 5 nm space the responsivity only changes 0.5%. Therefore, over a small range of wavelengths, the responsivity of this kind of photodiode is quite flat versus wavelength.

Current narrow spaced WDM communication systems use wavelengths with only a few nanometer spaces. The application of photodiodes to these systems requires a wavelength meter and photodetector which can detect wavelength spaces around 1 nm. Commercially available optical spectrum analyzers which use a mechanical grating technique can detect a smaller wavelength space. However, the speed of mechanical tuning is not fast enough and not suitable for signal detections. Moreover, these mechanical devices are very expensive. Consequently, more cost-effective wavelength meters and photodetectors are needed to be of use in any of the above-mentioned applications.

Several approaches have been taken in developing more suitable readers and detectors. One solution involves monolithic integrated gratings, as described by Soole J. B. D., et al. in "Monolithic InP-based grating spectrometer for wavelength-division-multiplexed systems at 1.5 µm", Electronics Letters, 1991, Vol. 27, pp. 132–134. Other research has focused on resonant cavity photodetectors, such as described by Kishino, K., et al. in "Resonant cavity-enhanced (RCE) photodetectors", IEEE J. Quantum Electr., 1991, 27, (8), pp. 2025–2034, and a tapered waveguide coupled to a vertical cavity resonator, as described by Pezeshki, B., et al. in "Vertical cavity waveguide spectrometer for WDM communication", LEOS '93 Conference Proceedings, pp. 198–199.

OBJECTS AND ADVANTAGES OF THE INVENTION

It is a basic object of the present invention to provide an easy-to-design and fabricate, compact, reliable and cost-effective wavelength meter or reader and photodetector with a resolution of 1 nm or less.

The principle advantage of the invention is that it can sense wavelengths with a very good resolution, such that a small difference between two wavelengths can be detected.

Further objects and advantages of the invention are described in the detailed description and illustrated with the aid of the drawing figures.

SUMMARY OF THE INVENTION

In this invention an arrangement of two back-to-back detectors with a wavelength dependent reflector in between is used to provide the necessary spectral dependence ratio for the two detectors. The ratio is a monotonic function of the signal wavelength, and thus it can be used as an indication of wavelength. Each photodetector can still be used as a receiver for data in addition to wavelength reading.

The object of the invention is attained in an arrangement of the above kind by means of molecular beam epitaxy (MBE) or other commonly known monolithic processes.

DETAILED DESCRIPTION

Figure 1:
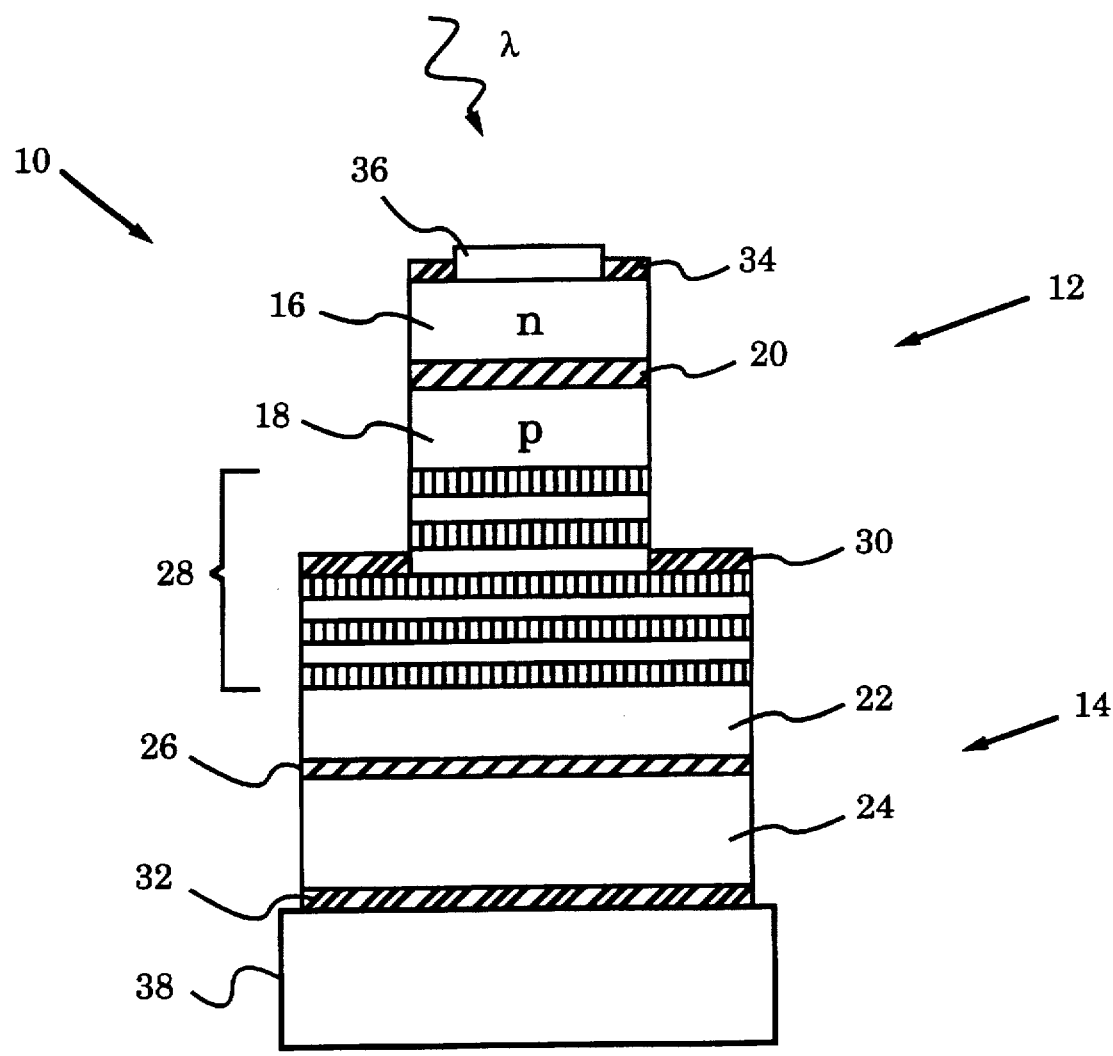
FIG. 1 is a schematic side view of a wavelength meter and photodetector according to the invention.

FIG. 1 shows a preferred embodiment of a wavelength meter and photodetector 10 according to the invention. Wavelength meter and photodetector 10 has a top photodiode 12 and a bottom photodiode 14. Top photodiode 12 is made of an n-doped top layer 16 deposited on a p-doped bottom layer 18. Of course, photodiodes could be grown on n-type substrates, in which case the resulting structure will be p-n-p. In the preferred embodiment, the resulting structure is n-p-n. Top and bottom layers 16 and 18 are made of n- and p-doped semiconducting materials respectively, e.g., doped GaAs. Interposed between top and bottom layers 16 and 18 is an active layer 20. Active layer 20 comprises a photodetecting material capable of absorbing photons and generating an electrical response. Such materials and their photodetecting capabilities are well known to anyone skilled in the art. In the preferred embodiment, active layer 20 consists of ten $In_{0.2}Ga_{0.8}As$ quantum wells.

Bottom photodiode 14 is made of a p-doped top layer 22 and an n-doped bottom layer 24. In this embodiment top and bottom layers 22 and 24 are also made of doped GaAs. An active layer 26 is interposed between top layer 22 and bottom layer 24. Active layer 26 consists of twenty $In_{0.2}Ga_{0.8}As$ quantum wells. It should be noted that active layer 26, by virtue of having twice as many quantum wells as active layer 20 is twice as sensitive.

A reflector 28 is sandwiched between top photodiode 12 and bottom photodiode 14. The reflectivity R of the reflector 28 is wavelength-dependent, i.e. $R=R(\lambda)$. The wavelength dependence for mirrors and other reflectors depends on the semiconductor material used and the design of the mirror. Methods of mirror design suitable for this invention are well known in the art and are discussed by J. A. Dobrowolski in "Subtractive Method of Optical Thin Film Interference Filter Design" Applied Optics, August 1973, Vol. 12, No. 8, which is incorporated herein by reference. It is particularly advantageous to have a linear dependence of $(1+R)/(1-R)$ on $\lambda$, although exponential and any other one-to-one relationships can be used. Reflector 28 should also have a low resistance to avoid RC coupling and produce a fast response. In addition, reflector 28 can be graded next to p-doped bottom layer 18 and p-doped top layer 22 for better mirror response behavior.

The present embodiment employs a distributed Bragg reflector (DBR) as reflector 28. In particular, reflector 28 consists of 10.5 pairs of AlAs/GaAs layers. FIG. 1 only shows a few of the DBR layers for reasons of clarity.

DBR mirror 28 is etched at its midpoint to reduce the waist of wavelength meter and photodetector 10 and to provide space for a middle electrical contact 30. Most conveniently, contact 30 is deposited on the ledge created after etching DBR mirror 28 at its midpoint. A bottom electrical contact 32 is located on the bottom of bottom photodiode 14. Finally, a top electrical contact 34 is deposited on top of top photodiode 12. It is possible to make electrical contacts of materials which are optically transparent at wavelengths of the photons to be measured. A person skilled in the art will know how to find a suitable contact material. In the preferred embodiment, however, top electrical contact 34 is deposited around the edge of top layer 16 only. This leaves space for an anti-reflecting coating 36, which serves to improve the sensitivity of the device by increasing photon admission. In the preferred embodiment, coating 36 is made of silicon nitride.

When in operation, wavelength meter and photodetector 10 admits photons of a given wavelength $\lambda$ through antireflective coating 36. Any photon traveling through top photodiode 12 has a certain probability P of being detected (through absorption) by active layer 20. Assuming that the photon is not detected, it will propagate to DBR 28. Since DBR 28 is a wavelength-dependent reflector, the photon, depending on its wavelength, has a probability $R(\lambda)$ of being reflected and a probability $1-R(\lambda)$ of being transmitted.

In the case of transmission, the photon enters bottom photodiode 14.

Thus the probability of detecting a photon in top photodiode 12 is proportional to $1+R$ and the probability of detecting a photon in bottom photodiode 14 is proportional to $1-R$.

Figure 2A:
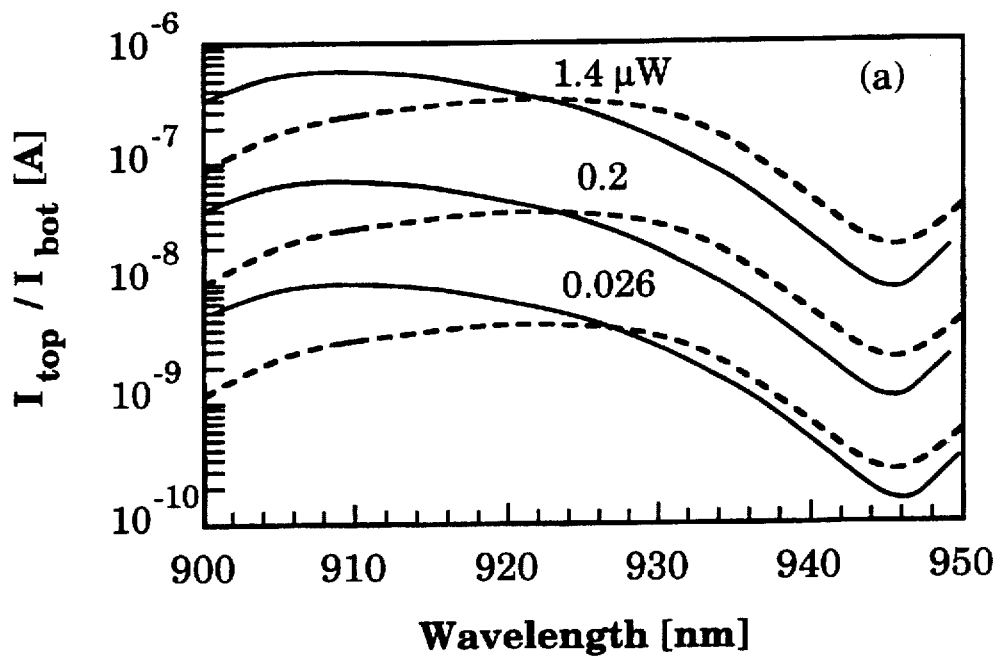
FIG. 2A are graphs of the photo response spectra of the top and bottom photodiodes of the wavelength meter and photodetector shown in FIG. 1.

This means that the relative number of photons detected in the two photodiodes 12 and 14 depends on the reflectivity of DBR 28 only. This is confirmed by the graphs in FIG. 2A which show the photoresponse of top photodiode 12 (solid lines) and bottom photodiode 14 (dashed lines) for three very different optical input intensities: 1.4, 0.2, and 0.026 µW. At the response spectrum maximum of 910 nm the responsivity of top photodiode 12 is 0.36 A/W.

In practice one measures the ratio of the responses of top photodiode 12 to bottom photodiode 14 by monitoring the current $I_{top}$ generated in top photodiode 12 and the current $I_{bottom}$ generated in bottom photodiode 14. Let $P_1$ be the probability of a photon being detected per one pass through top photodetector 12. Then the net probability for a photon to be detected by top photodiode 12 is $P_1(1+R)$. Correspondingly, the probability for a photon to be detected by bottom photodiode 14 is $(1-P_1)(1-R)P_2$, where $P_2$ is the probability for a photon to be detected per pass by bottom photodiode 14. Thus, we can write:

$$\frac{I_{top}}{I_{bottom}} = \frac{P_1(1+R)}{(1-P_1)(1-R)P_2}.$$

If $P_1$ and $P_2$ are chosen to have flat dependencies on wavelength in the spectral region of interest, as discussed in the background section, then this ratio is determined mostly by the reflectivity spectrum:

$$\frac{I_{top}}{I_{bottom}} \propto \frac{1+R}{1-R}.$$

In particular, $I_{top}$ is monitored between top electrical contact 34 and middle electrical contact 30, while $I_{bottom}$ is measured between middle electrical contact 30 and bottom electrical contact 32.

Figure 2B:
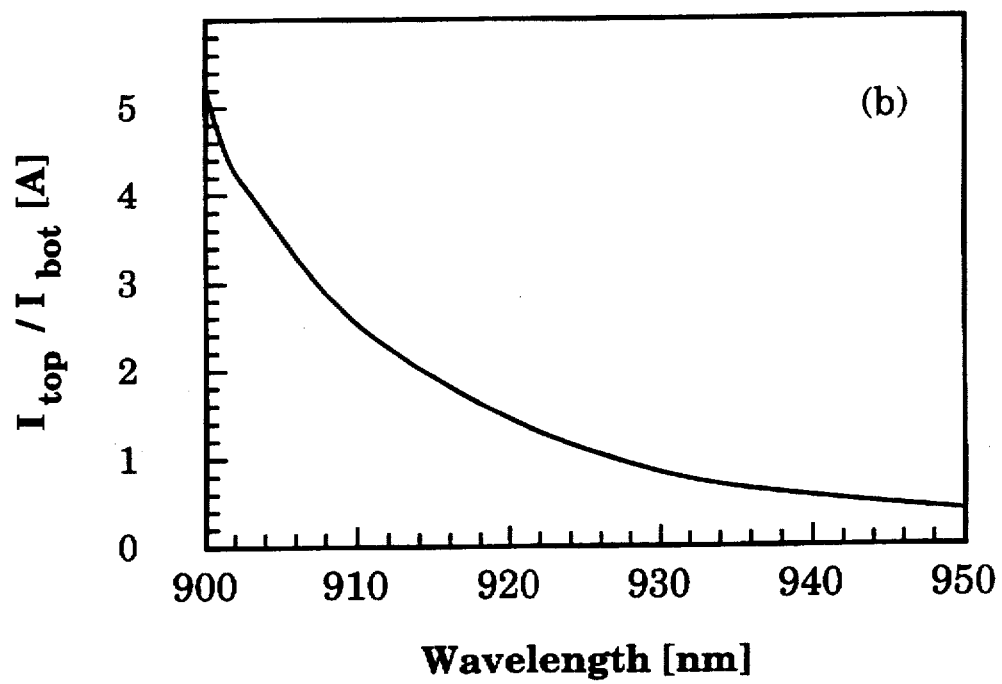
FIG. 2B are graphs of the ratios of currents in the top and bottom photodiodes according to the invention.

FIG. 2B graphically illustrates the ratio of currents $I_{top}/I_{bottom}$ versus wavelength for the three above-mentioned input intensities. Again, it is clear that this ratio does not depend on input intensity but the reflectivity R of DBR 28. Therefore, wavelength meter and photodetector 10 acts as an intensity-independent wavelength reader. The spectral range of wavelength meter and photodetector 10 is determined by the width of DBR mirror 28 spectrum edge. In the present embodiment the spectral span is 40 nm (from 900 nm to 940 nm) and the achievable resolution is 1 nm.

Figure 3A:
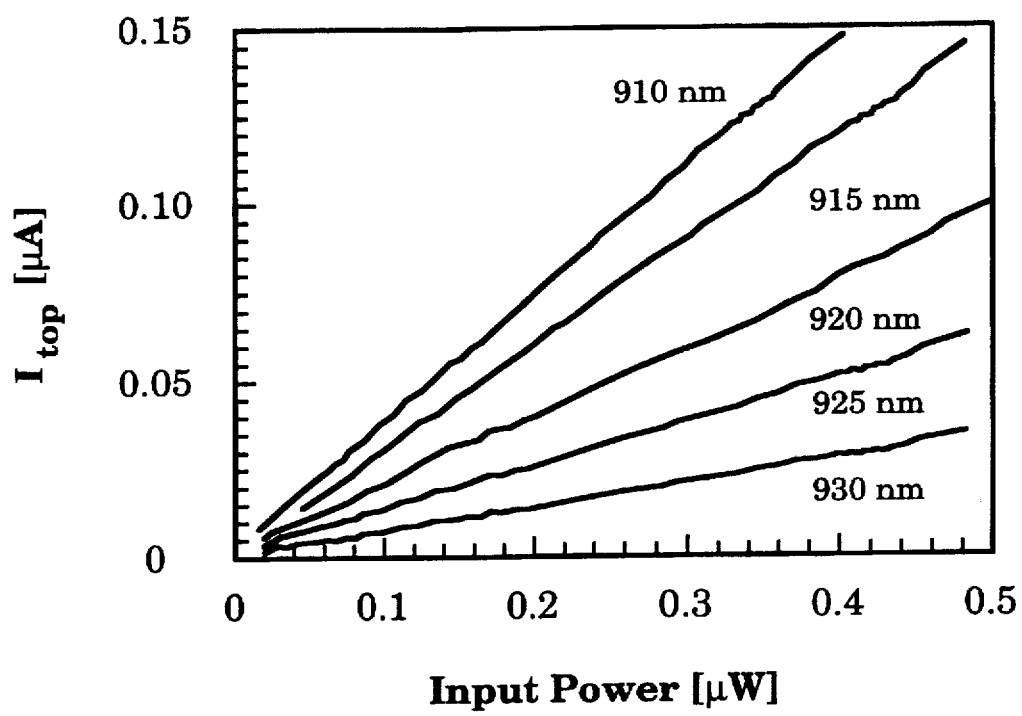
FIG. 3A is a graph of the input power as a function of current in the top photodiode for five different wavelengths.
Figure 3B:
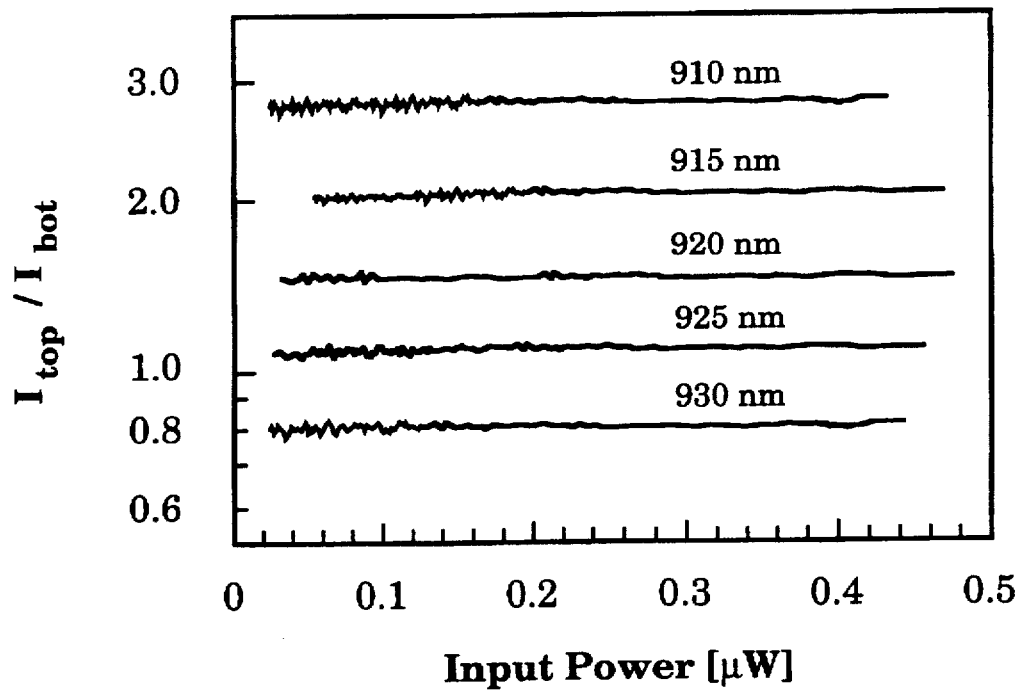
FIG. 3B is a graph of the input power as a function of the ratio of currents for the top and bottom photodiodes for five different wavelengths.

The resolution of wavelength meter and photodetector 10 is determined by the noise encountered in measuring the $I_{top}/I_{bottom}$ ratio. The graphs in FIG. 3B shows the dependence of this ratio on input intensity for different wavelengths. The graphs in FIG. 3A show how the current in the top photodetector responds at different wavelengths when the input power increases. The noise in the signal is due to instabilities and mode-hopping in the Ti-sapphire laser used for characterizing the response of wavelength meter and photodetector 10.

In addition to acting as a wavelength meter, device 10 can be simultaneously used to measure light intensity as a photodetector. This is done by measuring the absolute values of currents $I_{top}$ and $I_{bottom}$.

The wavelength meter of the invention can also be used for measuring the temperature of a black body. The spectrum of black body radiation depends on the temperature of the emitting black body:

$$I_{bb} \propto \frac{1}{\lambda^5(e^{h\nu/kT}-1)}.$$

Under detection of black body thermal radiation the ratio of the signals from photodetectors 12 and 14 is:

$$\frac{I_{top}}{I_{bottom}} \propto \frac{\int I_{bb}(\lambda)(1+R(\lambda))ds}{\int I_{bb}(\lambda)(1-R(\lambda))ds}.$$

Figure 4:
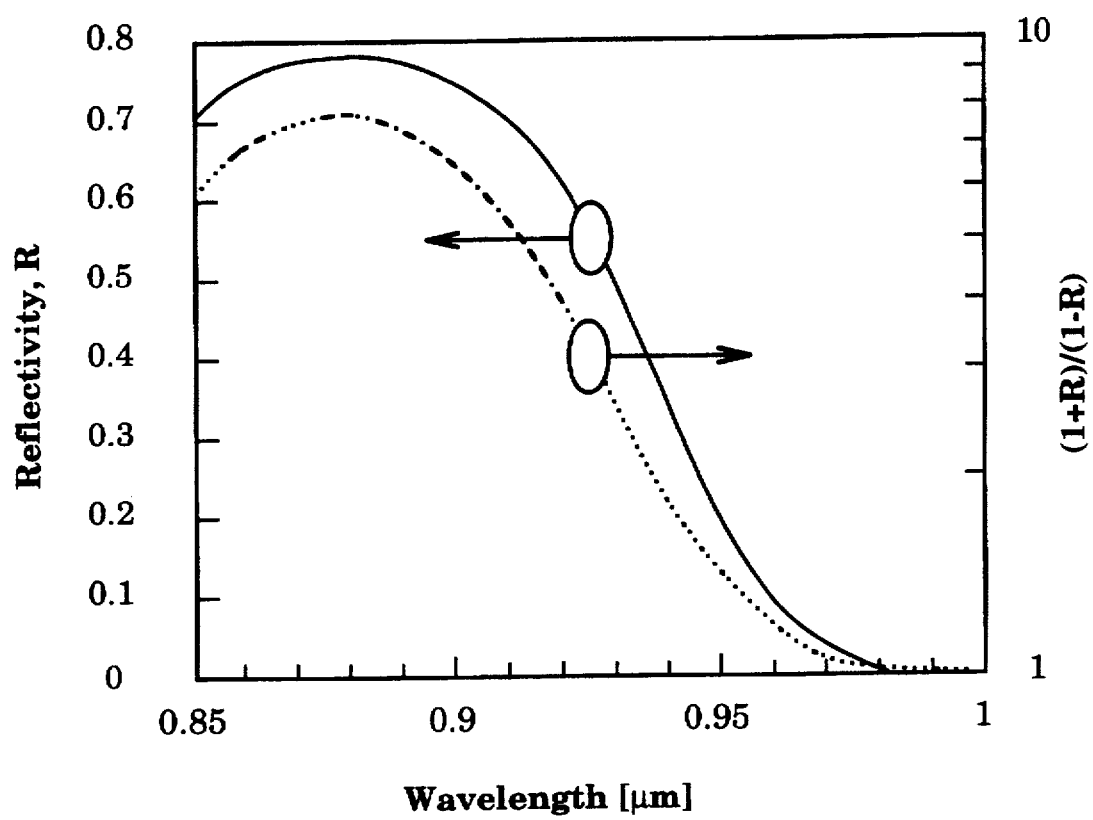
FIG. 4 is a graph depicting the edge of reflection band shift for 9.5 pairs of AlAs (664.7 nm)/$Al_{0.2}Ga_{0.8}As$ (567.2 nm) according to the invention.
Figure 5:
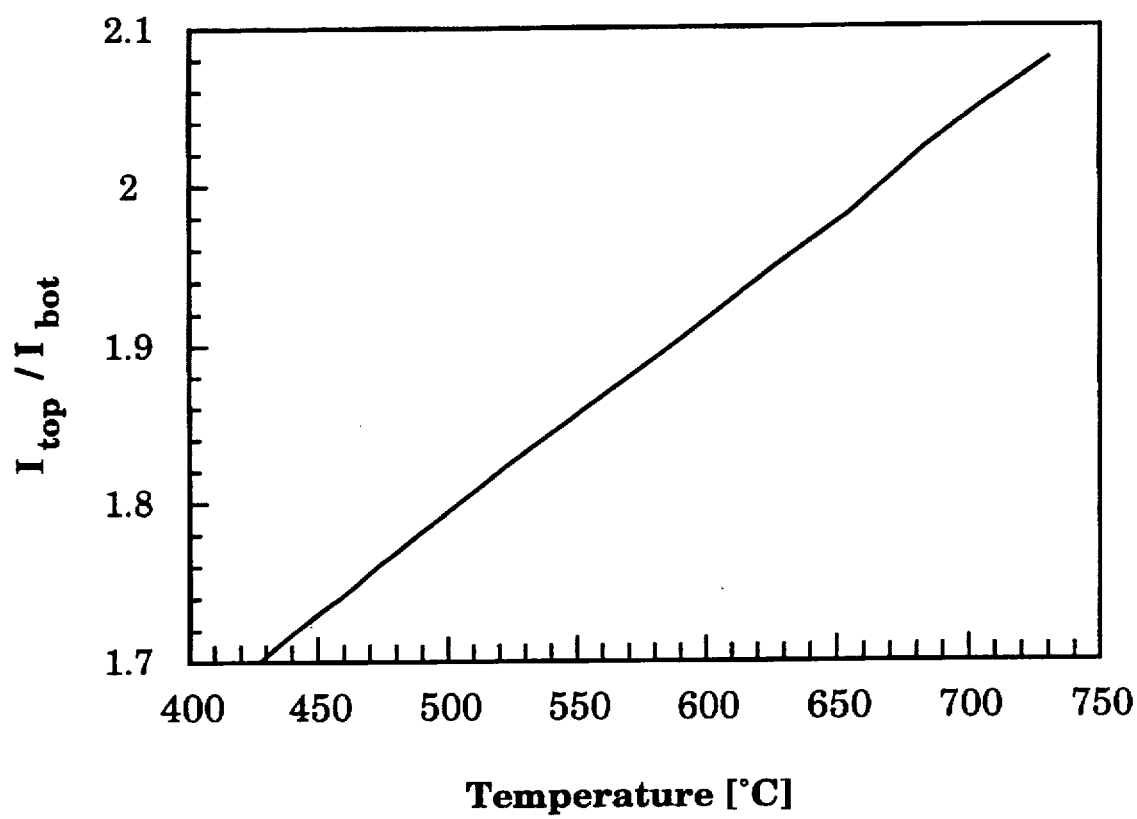
FIG. 5 is a graph illustrating the signal ratio for top and bottom photodetectors vs. temperature for black body radiation detection according to the invention.

Thus, using the wavelength-dependent edge of reflectivity band it is possible to detect the temperature T of the emitting black body. In fact, when using 9.5 pairs of AlAs (664.7 nm)/Al$_{0.2}$Ga$_{0.8}$As (567.2 nm) as the mirror, the edge of the reflection band shifts from 0.88 to 0.98 μm. This is shown in FIG. 4. The ratio of calculated signals depends almost linearly on temperature; see FIG. 5. Al$_{0.2}$Ga$_{0.8}$As active regions are used in the calculations. An accuracy of 10° C. is easily achieved in this measurement.

Because the reflectivity $R(\lambda)$ depends on the temperature it is important to use a thermostability system to maintain the photodetectors at a constant temperature. A conventional Peltier element, which can either deliver or absorb heat depending on a bias voltage, can be used for this purpose. Thermal regulation using Petier devices is well understood in the art. An exemplary thermostability system consisting of a single Peltier element 38 is shown in FIG. 1

It will be clear to one skilled in the art that the above embodiment may be altered in many ways without departing from the scope of the invention. Accordingly, the scope of the invention should be determined by the following claims and their legal equivalents.

What is claimed is:

1. A device comprising:
    a top photodiode;
    a bottom photodiode;
    a reflector sandwiched between the top photodiode and the bottom photodiode, the reflector having a reflectivity that is wavelength-dependent and in one-to-one correspondence with wavelength;
    a middle electrical contact which is located at a midpoint of the reflector;
    a bottom electrical contact which is located on a bottom of the bottom photodiode;
    a top electrical contact which is deposited near a top of the top photodiode.

2. The device as recited in claim 1 wherein the reflector comprises a multi-layer distributed Brag reflector (DBR) with a low resistance.

3. The device as recited in claim 1 wherein:
    the top photodiode comprises an n-doped top layer on a p-doped bottom layer and a top active layer interposed between the top and bottom layers; and
    the bottom photodiode comprises a p-doped top layer on an n-doped bottom layer and a bottom active layer interposed between the top and bottom layers.

4. The device as recited in claim 3 wherein the top active layer and the bottom active layer each comprises a photo-detecting material capable of absorbing photons and generating an electrical response.

5. The device as recited in claim 3 wherein:
    the top active layer comprises a number of top quantum wells;
    the bottom active layer comprises a number of bottom quantum wells; and
    the number of bottom quantum wells is greater than the number of top quantum wells.

6. The device as recited in claim 1 wherein:
    the top photodiode comprises a p-doped top layer on an n-doped bottom layer and a top active layer interposed between the top and bottom layer; and
    the bottom photodiode comprises an n-doped top layer on a p-doped bottom layer and a bottom active layer interposed between the top and bottom layers.

7. The device as recited in claim 6 wherein the top active layer and the bottom active layer each comprises a photo-detecting material capable of absorbing photons and generating an electrical response.

8. The device as recited in claim 6 wherein:
    the top active layer comprises a number of top quantum wells;
    the bottom active layer comprises a number of bottom quantum wells; and
    the number of bottom quantum wells is greater than the number of top quantum wells.

9. The device as recited in claim 1 wherein:
    the top electrical contact is deposited around the edge of the top layer of the top photodiode; and
    the device further comprises an anti-reflecting coating comprising silicon nitride.

10. The device as recited in claim 1 wherein the top electrical contact comprises an optically transparent material.

11. The device as recited in claim 1 further comprising an anti-reflecting coating on the top photodiode.

12. The device as recited in claim 1 further comprising a thermostability system for maintaining the device at a constant temperature.

13. A method for photodetection comprising the step of measuring a light signal using a device comprising:
    a top photodiode;
    a bottom photodiode;
    a reflector sandwiched between the top photodiode and the bottom photodiode, the reflector having a reflectivity that is wavelength-dependent and in one-to-one correspondence with wavelength;
    a middle electrical contact which is located at a midpoint of the reflector;
    a bottom electrical contact which is located on a bottom of the bottom photodiode;
    a top electrical contact which is deposited near a top of the top photodiode.

14. The method as recited in claim 13 wherein the reflector comprises a multi-layer distributed Brag reflector (DBR) with a low resistance.

15. The method as recited in claim 13 wherein the top and bottom photodiodes each comprises a photodetecting material capable of absorbing photons and generating an electrical response.

16. The method as recited in claim 13 wherein:

the top photodiode comprises a number of quantum wells;

the bottom photodiode comprises a number of quantum wells; and the number of bottom quantum wells is greater than the number of top quantum wells.

17. The method as recited in claim 13 wherein:

the top electrical contact is deposited around the edge of the top layer of the top photodiode; and the device comprises an anti-reflecting coating comprising silicon nitride.

18. The method as recited in claim 13 wherein the top electrical contact comprises an optically transparent material.

19. The method as recited in claim 13 wherein the device further comprises an anti-reflecting coating on the top photodiode.

20. The device as recited in claim 13 further comprising a thermostability system for maintaining the device at a constant temperature.

21. A method for wavelength detection comprising the step of measuring a light signal using a device comprising:

a top photodiode;

a bottom photodiode;

a reflector sandwiched between the top photodiode and the bottom photodiode, the reflector having a reflectivity that is wavelength-dependent and in one-to-one correspondence with wavelength;

a middle electrical contact which is located at a midpoint of the reflector;

a bottom electrical contact which is located on a bottom of the bottom photodiode;

a top electrical contact which is deposited near a top of the top photodiode.

22. The method as recited in claim 21 wherein the reflector comprises a multi-layer distributed Brag reflector (DBR) with a low resistance.

23. The method as recited in claim 21 wherein the top and bottom photodiodes each comprises a photodetecting material capable of absorbing photons and generating an electrical response.

24. The method as recited in claim 21 wherein:

the top photodiode comprises a number of quantum wells;

the bottom photodiode comprises a number of quantum wells; and the number of bottom quantum wells is greater than the number of top quantum wells.

25. The method as recited in claim 21 wherein:

the top electrical contact is deposited around the edge of the top layer of the top photodiode; and the device comprises an anti-reflecting coating comprising silicon nitride.

26. The method as recited in claim 21 wherein the top electrical contact comprises an optically transparent material.

27. The method as recited in claim 21 wherein the device further comprises an anti-reflecting coating on the top photodiode.

28. The method as recited in claim 21 further comprising the step of maintaining the device at a constant temperature by using a thermostability system.

* * * * *